United States Patent
Tomohiro et al.

[11] Patent Number: 6,133,809
[45] Date of Patent: *Oct. 17, 2000

[54] LC FILTER WITH A PARALLEL GROUND ELECTRODE

[75] Inventors: Takashi Tomohiro, Fukui-ken; Takahiro Azuma, Fukui; Hidetoshi Yamamoto, Fukui-ken; Toshimi Kaneko, Sabae; Yasuhiro Nakata, Fukui, all of Japan

[73] Assignee: Murata Manufacturing Co., Ltd., Nagaokakyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/844,644

[22] Filed: Apr. 21, 1997

[30] Foreign Application Priority Data

| Apr. 22, 1996 | [JP] | Japan | 8-099980 |
| Apr. 24, 1996 | [JP] | Japan | 8-102881 |
| Apr. 24, 1996 | [JP] | Japan | 8-102882 |

[51] Int. Cl.$^7$ ................................. A03H 7/01
[52] U.S. Cl. .................... 333/185; 333/184; 336/200
[58] Field of Search ...................... 333/184, 185; 336/200, 232

[56] References Cited

U.S. PATENT DOCUMENTS

| 3,812,442 | 5/1974 | Muckelroy | 336/200 |
| 5,392,019 | 2/1995 | Ohkubo | 333/185 X |
| 5,530,411 | 6/1996 | Nakata et al. | 333/185 |
| 5,777,533 | 7/1998 | Kato et al. | 333/185 |

FOREIGN PATENT DOCUMENTS

| 4116295A1 | 11/1991 | Germany . | |
| 2-165608 | 6/1990 | Japan . | |
| 2-202006 | 8/1990 | Japan . | |
| 3-225905 | 10/1991 | Japan . | |
| 6-69040 | 3/1994 | Japan . | |
| 6-275466 | 9/1994 | Japan . | |
| 7-249952 | 9/1995 | Japan . | |
| 7-249953 | 9/1995 | Japan . | |
| 7-283031 | 10/1995 | Japan . | |
| 8-55726 | 2/1996 | Japan | 333/185 |
| 2303495 | 2/1997 | United Kingdom | 333/185 |

*Primary Examiner*—Justin P. Bettendorf
*Attorney, Agent, or Firm*—Burns, Doane, Swecker & Mathis, LLP

[57] ABSTRACT

An LC filter is disclosed which exhibits excellent attenuation characteristics in a high-frequency range and substantially preserves its self-inductance and Q-factor. The LC filter is constructed of a laminated block formed by laminating insulating sheets each provided with a coil conductor. The coil conductors are connected in series to each other through via-holes to form a coil. Input/output external electrodes and ground external electrodes are disposed on the surfaces of the laminated block. The insulating sheets are laminated in a direction perpendicular to the input/output external electrodes and parallel to the mounting surface. The coil is axially placed perpendicular to the input/output external electrodes and parallel to the ground external electrodes and the mounting surface. A distributed capacitance is generated between the coil and each of the ground external electrodes to form a capacitor.

20 Claims, 18 Drawing Sheets

FIG. 4
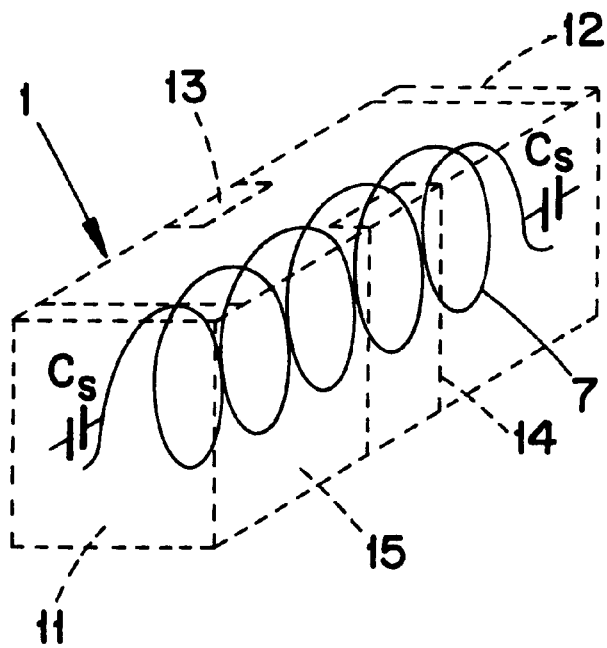
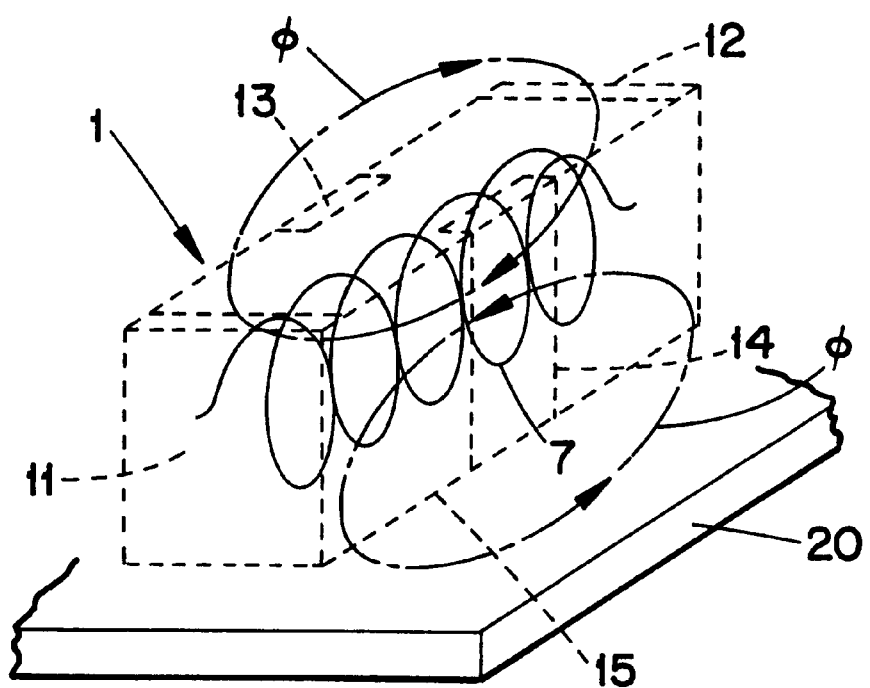
FIG. 5

FIG. 25
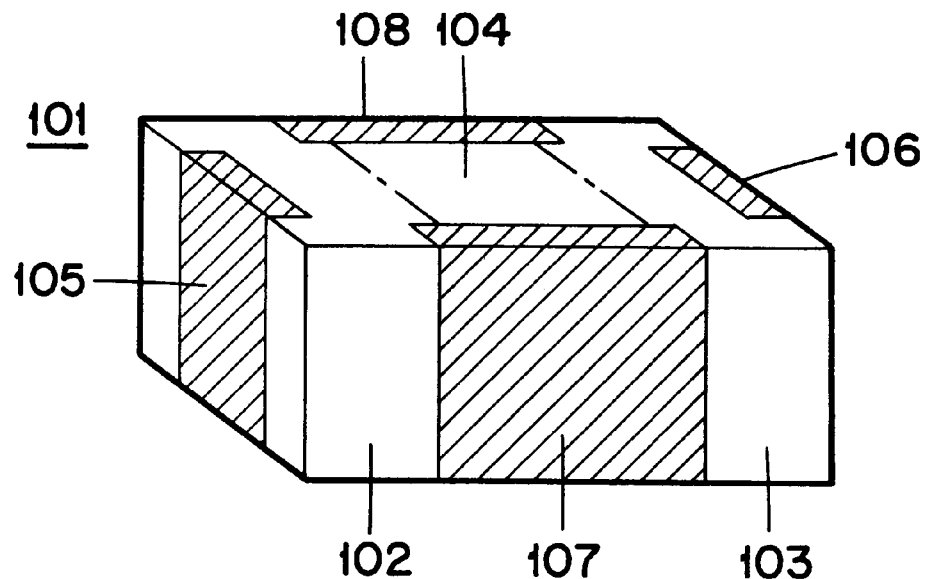
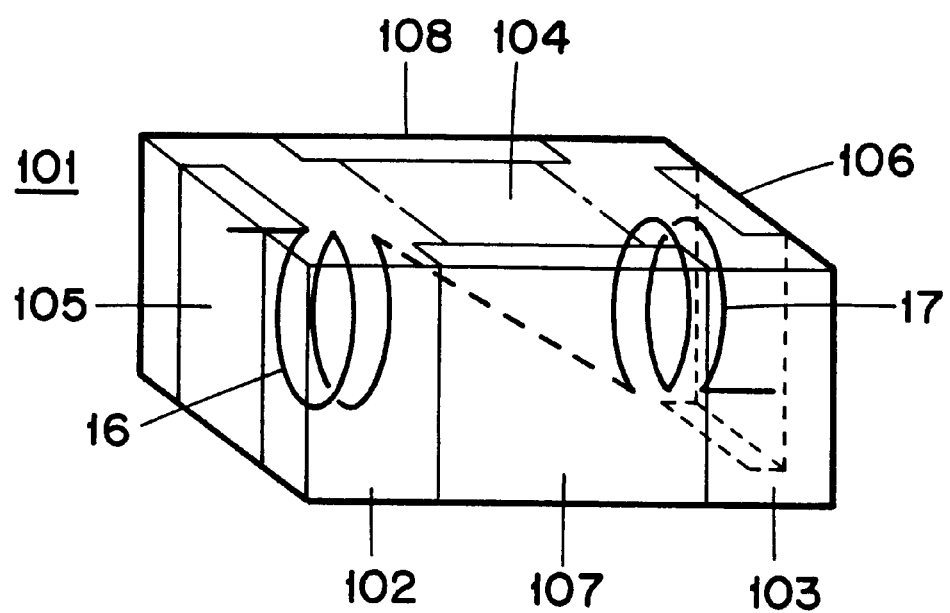
FIG. 26

LC FILTER WITH A PARALLEL GROUND ELECTRODE

BACKGROUND OF THE INVENTION

1. Field of the Invention

The present invention relates generally to LC filters and, more particularly, to an LC filter used as a noise filter or the like.

2. Description of the Related Art

As an example of conventional LC filters, an LC filter 51 is shown in FIG. 9. This filter 51 is formed of a plurality of insulating sheets 52, and more specifically, insulating sheets 52 on which coil conductors 53, 54, 55, 56, 57 and 58 are respectively disposed, a central insulating sheet 52 on which a central capacitor electrode 60 is provided, and insulating sheets 52 used as external layers. Capacitor electrodes 59 and 61 are formed on the insulating sheets 52 adjacent to the central insulating sheet 52, with the capacitor electrodes 59 and 61 being electrically connected to the central portions of the respective coil conductors 55 and 56 on the same insulating sheet 52. The coil conductors 53 through 55 in one half of the filter 51 are electrically connected in series to each other through via-holes 62*a*, 62*b* and 62*c* in the insulating sheets 52 to form a first coil 63. Moreover, the coil conductors 56 through 58 in the other half of the filter 51 are electrically connected in series to each other through via-holes 62*d*, 62*e* and 62*f* to form a second coil 64. The central capacitor electrode 60 opposingly faces each of the capacitor electrodes 59 and 61, and a capacitor can be formed by these electrodes 59 through 61.

The above-described sheets 52 are laminated and then integrally sintered to form a laminated block. Subsequently, as illustrated in FIG. 10, input/output external electrodes 74 and 73 are respectively formed on the left and right sides of the laminated block, while ground external electrodes 75 and 76 are respectively disposed on the proximal side and the distal side of the laminated block. The first input/output external electrode 73 is electrically connected to one end of the first coil 63, while the second input/output external electrode 74 is electrically coupled to one end of the second coil 64. Further, the ground external electrodes 75 and 76 are each respectively electrically connected to one end of the central capacitor electrode 60.

In the LC filter 51 of this conventional type, the external electrodes 73 through 76 are located parallel to the axis of the coils 63 and 64, and the sheets 52 are laminated along the external electrodes 73 through 76.

Another example of conventional LC filters, such as the one disclosed in Japanese Unexamined Patent Publication No. 7-283031, is also known. That is, a plurality of insulating sheets on which coil conductors are disposed are laminated, and the coil conductors are connected in series to each other through via-holes to form a laminated block. Input/output external electrodes and ground external electrodes are then formed on the laminated block in directions parallel to the axis of the coils.

Referring back to the LC filter 51 shown in FIGS. 9 and 10, the following problems are encountered. When the distances between the input/output external electrode 73 and the coil 63 and between the electrode 74 and the coil 64 are increased, stray capacitances generated therebetween can be inhibited. If, however, the LC filter 51 is comparatively small (for example, a length of 1.6 mm and a width of 0.8 mm or smaller), the input/output external electrodes 73 and 74 are brought closer to the coils 63 and 64, respectively, as illustrated in FIG. 10, thereby increasing the stray capacitances Cs therebetween.

Further, the known LC filter is constructed such that the ground external electrodes 75 and 76 are disposed to opposingly face the coils 63 and 64 over the entire length of the coils 63 and 64, i.e., from the input terminal of the coil 64 to the output terminal of the coil 63. This increases the stray capacitances Cs. Additionally, the stray capacitances Cs are increased in proportion to the number of turns of the coils 63 and 64.

By application of this laminated LC filter 51 to a noise filter, noise entering one input/output external electrode 74 circumventively travels to the other input/output external electrode 73 via the stray capacitances Cs, as shown in FIG. 11. This deteriorates the attenuation characteristics of the filter 51 in a high frequency range, thereby failing to sufficiently exhibit performance as a noise filter.

Further, since the direction of magnetic flux ø generated in the coils 63 and 64 is perpendicular to the mounting surface 65 of the LC filter 51, an eddy current is disadvantageously produced due to this magnetic flux ø in a conductor pattern having a large area, such as a ground, on a printed wiring board 80. Accordingly, the magnetic flux ø is weakened due to the eddy current loss and further lowers its self inductance and Q-factor.

SUMMARY OF THE INVENTION

Accordingly, it is an object of the present invention to provide an LC filter which exhibits excellent attenuation characteristics in a high frequency range and also substantially maintains its self inductance and Q-factor when the filter is mounted on a printed wiring board.

In order to achieve the above object, according to the present invention, there is provided an LC filter comprising: a laminated block formed by laminating an internal conductor and an insulating layer; an input/output external electrode disposed on a surface of the laminated block; and a ground external electrode disposed on a surface of the laminated block, wherein the internal conductor is axially placed parallel to the ground external electrode.

In the above-described LC filter, the internal conductor may comprise a plurality of coil conductors and may be axially perpendicular to the plane of the input/output external electrode. The coil conductors and the insulating layers may be laminated in a direction perpendicular to the plane of input/output external electrode.

Alternatively, the internal conductor may comprise a plurality of coil conductors and may be axially parallel to the mounting surface. The coil conductors and the insulating layer may be laminated parallel to the mounting surface.

The insulating layer may comprise a via-hole electrically connected to the coil conductor, and a ground internal electrode surrounding the via-hole at a predetermined distance from the via-hole.

The LC filter may further comprise a capacitor electrode electrically connected to the coil conductors and opposingly facing the ground internal electrode so as to form a capacitor.

Further, the coil conductors may be electrically interconnected to each other through relay openings to form a coil which may be electrically connected at one end to the input/output external electrode through a lead opening, and the size of the lead opening is made larger than the size of the relay opening.

In the LC filter, the internal conductor may be a via-hole. In this case, the insulating layer may comprise a ground internal conductor surrounding the via-hole at a predetermined distance from the via-hole.

BRIEF DESCRIPTION OF THE DRAWINGS

FIG. 4 is a cutaway perspective view illustrating stray capacitances generated in the LC filter shown in FIG. 2;

FIG. 5 is a cutaway perspective view illustrating the magnetic flux generated in the LC filter shown in FIG. 2;

FIG. 25 is a perspective view illustrating the outer appearance of an LC filter according to a fifth embodiment of the present invention;

FIG. 26 is a cutaway perspective view of the LC filter shown in FIG. 25;

DESCRIPTION OF THE PREFERRED EMBODIMENTS

A description will now be given of embodiments of the present invention while referring to the accompanying drawings.

[First Embodiment: FIGS. 1 through 5]

Figure 1:
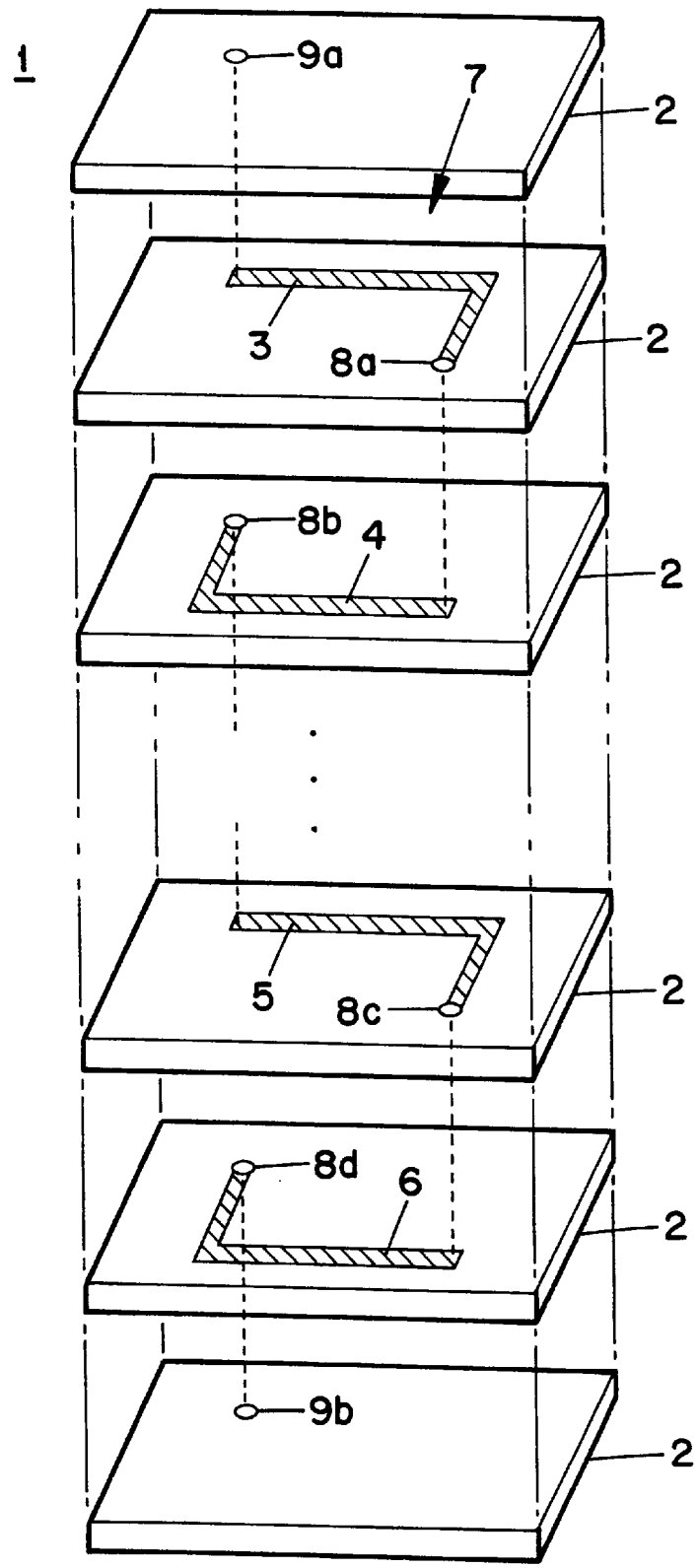
FIG. 1 is an exploded perspective view illustrating an LC filter according to a first embodiment of the present invention.

An LC filter generally designated by 1 is constructed, as shown in FIG. 1, of a plurality of interior insulating sheets 2 on which coil conductors 3, 4, 5 and 6 are respectively formed, and exterior insulating sheets 2 on which lead via-holes 9a and 9b are respectively provided. The coil conductors 3 through 6 are electrically connected in series to each other through relay via-holes 8a, 8b and 8c formed in the insulating sheets 2, thereby constructing a solenoid coil 7. A final relay via-hole 8d electrically connects a final coil conductor 6 to one of the lead via-holes 9b.

The coil conductors 3 through 6 are made from Ag, Pd, Ag—Pd, Cu and other conductive substances, and formed on the surfaces of the corresponding insulating sheets 2 by a known method, such as printing, sputtering, or vacuum deposition. Materials for the insulating sheets 2 may include ferrite materials, dielectric materials, or magnetic materials which have a relative dielectric constant $\epsilon r$ of 10 or greater. If a ferrite material is used for the insulating sheets 2, the LC filter 1 can exhibit excellent performance of noise reduction as a noise filter. By use of a dielectric material or a magnetic material having a relative dielectric constant $\epsilon r$ of 10 or greater, a large distributed capacitance can be formed between the coil 7 and below-described ground external electrodes 13 and 14. Moreover, if the insulating sheets 2 are formed in a square-like shape, there is no need to designate on which surface the ground electrodes 13 and 14 are formed and also on which surface the LC filter 1 is mounted on a printed wiring board. Thus, the operational performance can be improved.

Figure 2:
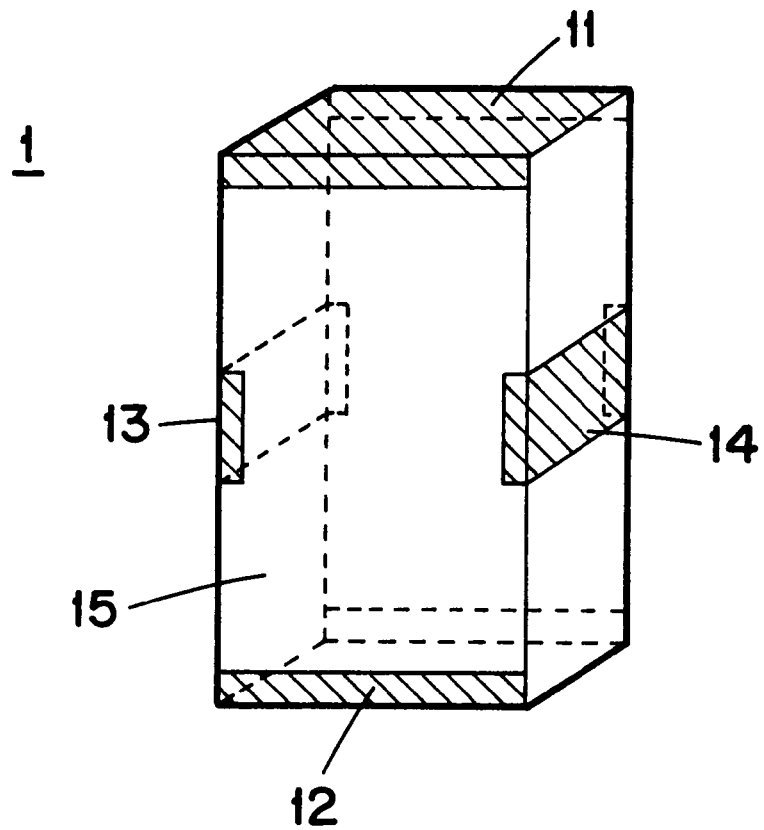
FIG. 2 is a perspective view illustrating the outer appearance of the LC filter shown in FIG. 1.

The insulating sheets 2 are laminated and then integrally sintered to form a laminated block. Thereafter, as illustrated in FIG. 2, input/output external electrodes 11 and 12 are respectively disposed on the upper and lower surfaces of the laminated block (i.e., surfaces at opposing ends of the coil 7), and also, ground external electrodes 13 and 14 are respectively formed on the left and right lateral surfaces of the laminated block (i.e., surfaces parallel to the axis of the coil 7). The distributed capacitance is generated between the coil 7 and the ground external electrodes 13 and 14 so as to form a capacitor. The external electrodes 11 through 14 are formed by means such as baking, sputtering or vapor-deposition.

Figure 3:
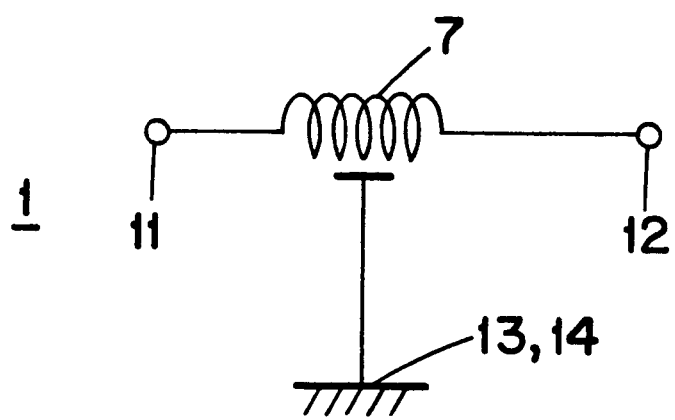
FIG. 3 is a diagram illustrating an electrical equivalent circuit of the LC filter shown in FIG. 2.

The first input/output external electrode 11 is electrically connected to one end of the first coil 7, i.e., one end of the coil conductor 3, through a first lead via-hole 9a. The second input/output external electrode 12 is electrically coupled to the other end of the coil 7, i.e., one end of the last coil conductor 6, through a final lead via-hole 9b. The electrical equivalent circuit of the LC filter 1 is shown in FIG. 3.

In the LC filter 1 constructed as described above, the axis of the coil 7 (the direction of magnetic flux ø in the coil 7) is perpendicular to the input/output external electrodes 11 and 12 and also parallel to the mounting surface 15 of the filter 1 used to mount the filter 1 to a substrate such as a printed wiring board 20. This decreases the potential difference between the coil 7 and the first input/output external electrode 11 and between the coil 7 and the second electrode 12 and also keeps a greater distance therebetween. Accordingly, the stray capacitances Cs generated between the coil 7 and the first input/output external electrode 11 and between the coil 7 and the second electrode 12 can be inhibited, as schematically shown in FIG. 4, to an extremely small level. Thus, when the above LC filter 1 is used as a noise filter, noise entering the first input/output external electrode 11 can be suppressed from circumventively travelling to the second input/output external electrode 12 via the stray capacitances Cs. As a consequence, it is possible to obtain a LC filter 1 which exhibits excellent attenuation characteristics in a high frequency range and provides sufficient performance as a noise filter.

Also, when the LC filter 1 is mounted on a printed wiring board 20, the direction of the magnetic flux ø generated in the coil 7 is, as schematically illustrated in FIG. 5, parallel to the mounting surface 15 of the filter 1. Thus, the intensity of the magnetic flux ø can be sufficiently maintained without being influenced by a conductor pattern having a large area, such as a ground. As a result, the self inductance and Q-factor of the LC filter 1 can be substantially preserved over known LC filters.

Further, the provision of insulating sheets provided with capacitor electrodes is unnecessary. Thus, insulating sheets made from the same material can be used to reduce cost of processing steps for forming insulating sheets, printing internal conductors, and laminating the sheets.

Figure 6:
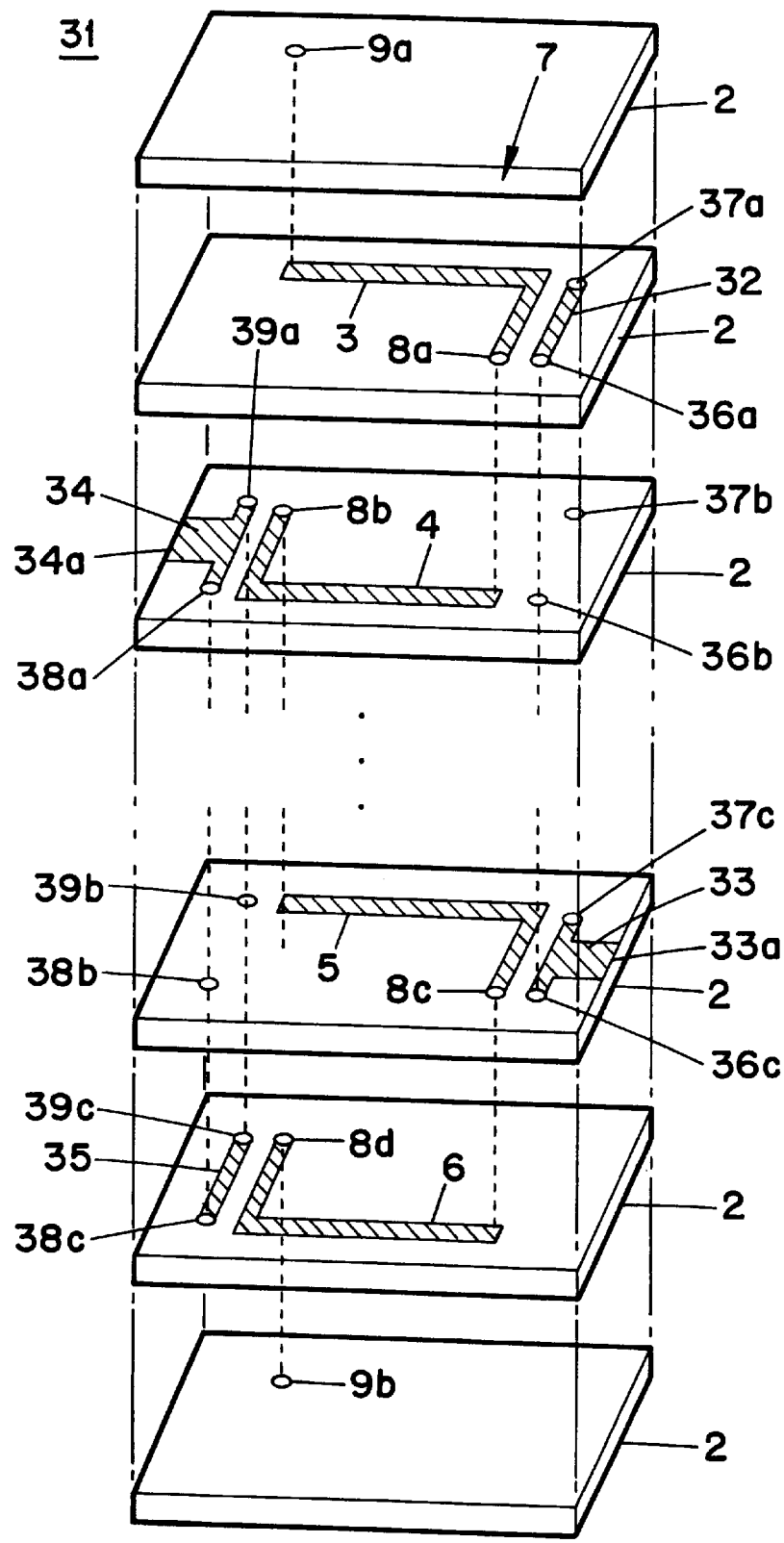
FIG. 6 is an exploded perspective view illustrating an LC filter according to a second embodiment of the present invention.
Figure 7:
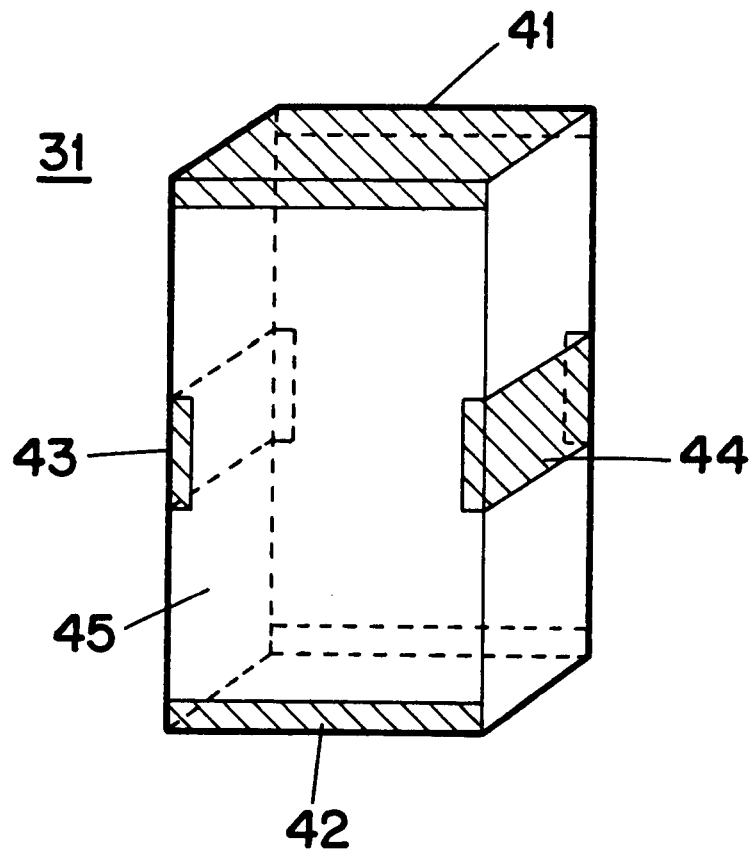
FIG. 7 is a perspective view illustrating the outer appearance of the LC filter shown in FIG. 6.
Figure 8:
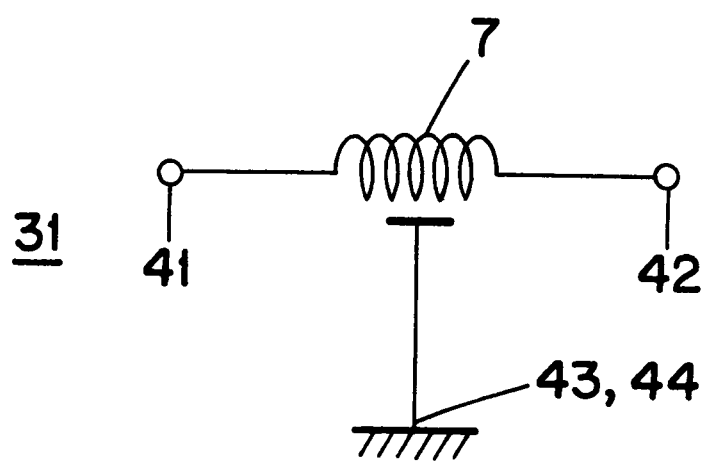
FIG. 8 is a diagram illustrating an electrical equivalent circuit of the LC filter shown in FIG. 7.
Figure 9:
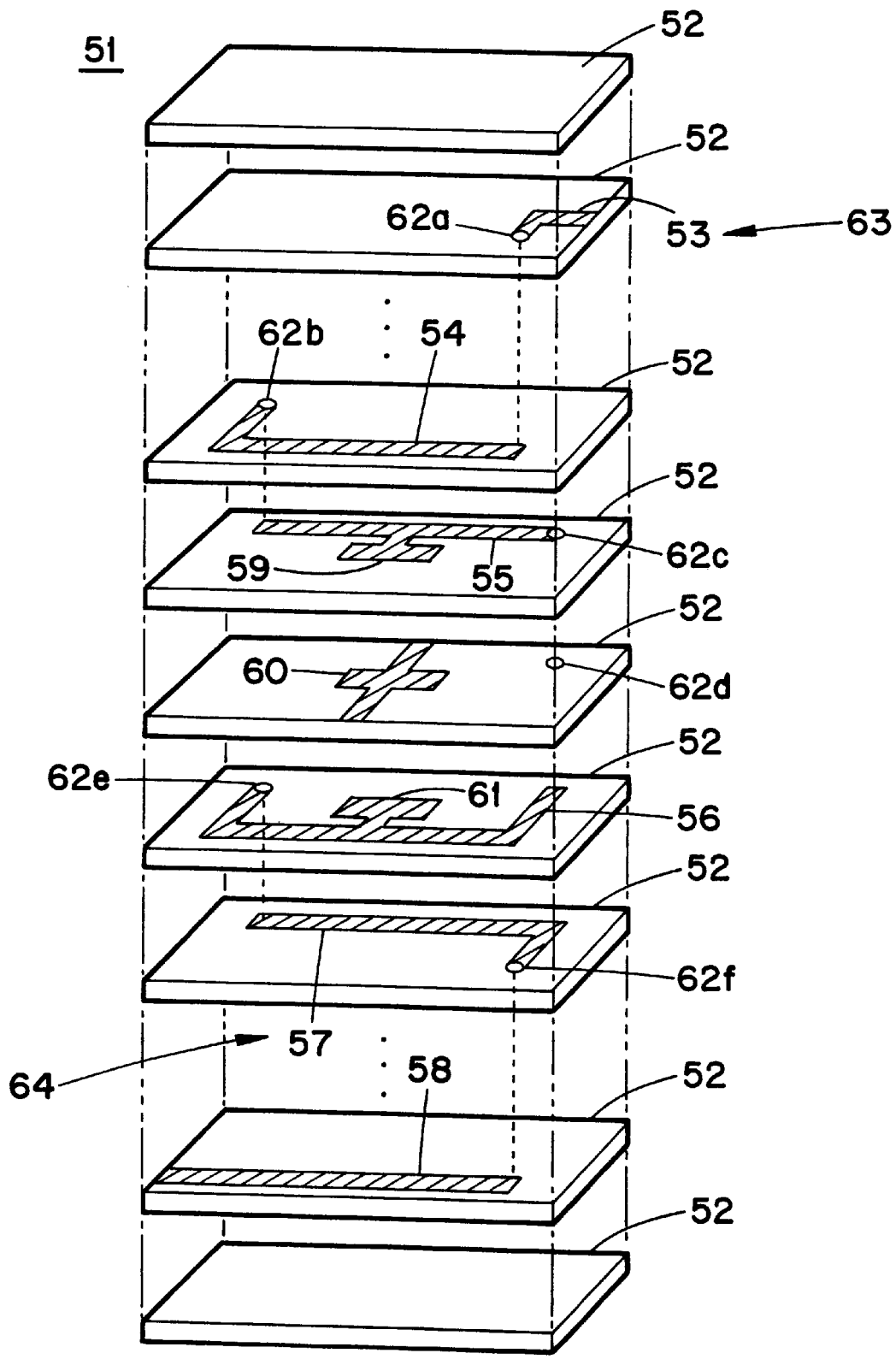
FIG. 9 is an exploded perspective view of a conventional LC filter.
Figure 10:
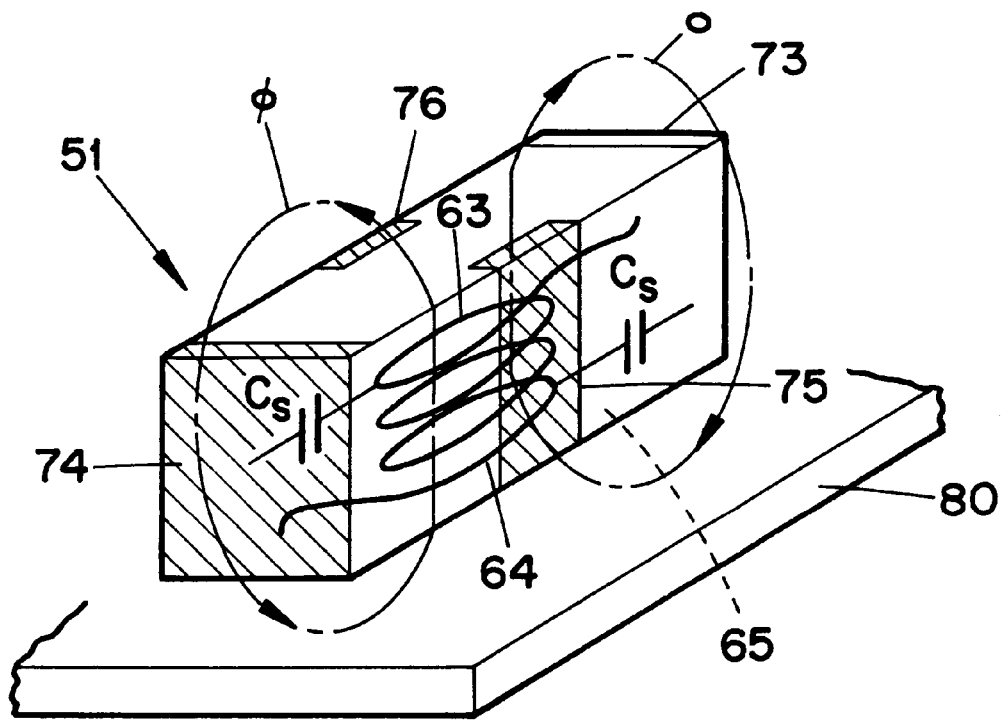
FIG. 10 is a cutaway perspective view of the LC filter shown in FIG. 9.
Figure 11:
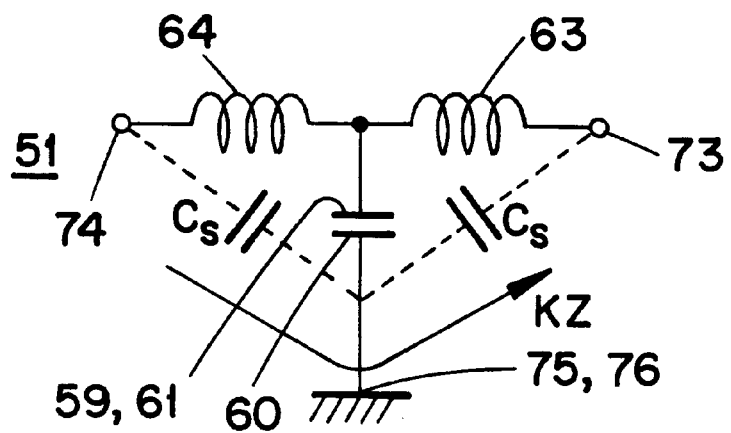
FIG. 11 is a diagram illustrating an electrical equivalent circuit of the LC filter shown in FIG. 9.

[Second Embodiment: FIGS. 6 through 8]

An LC filter generally indicated by 31 of the second embodiment is, as illustrated in FIG. 6, constructed in a manner similar to the LC filter 1 of the first embodiment, except for ground internal conductors 32, 33, 34 and 35 and ground via-holes 36a through 36c, 37a through 37c, 38a through 38c, and 39a through 39c for electrically connecting the internal conductors 32 through 35, respectively.

The ground internal conductors 32 through 35 with a linear shape are placed in proximity and parallel to the coil conductors 3 through 6 on the sheets 2. A lead portion 33a of the first ground internal conductor 33 is extended to the right side of the sheet 2, while a lead portion 34a of the second ground internal conductor 34 is extended to the left side of another sheet 2. The ground internal conductors 32 and 33 are electrically coupled through the via-holes 36a through 36c and 37a through 37c formed in the corresponding sheets 2. The internal conductors 34 and 35 are electrically connected through the via-holes 38a through 38c and 39a through 39c formed in the other sheets 2. A distributed capacitance is produced between the coil 7 and these ground internal conductors 32 through 35. A capacitor can thus be obtained.

The sheets 2 are laminated and then integrally sintered to form a laminated block. Thereafter, as shown in FIG. 7, input/output external electrodes 41 and 42 are respectively formed on the upper and lower surfaces of the laminated block, and also, ground external electrodes 43 and 44 are respectively disposed on the left and right lateral surfaces of the laminated block. The first external electrode 41 is electrically connected to one end of the coil 7 through a first lead via-hole 9a, while the second external electrode 42 is electrically coupled to the other end of the coil 7 through a second lead via-hole 9b. The first ground external electrode 43 is electrically connected to the lead portion 34a of the first internal conductor 34, while the second external electrode 44 is electrically coupled to the lead portion 33a of the second internal conductor 33. In FIG. 7, there is further shown a mounting surface 45.

FIG. 8 is a diagram illustrating an electrical equivalent circuit of the LC filter 31. The thus-obtained LC filter 31 performs an operation and offers advantages similar to those of the LC filter 1 of the first embodiment. Additionally, a capacitor exhibiting a larger capacity can be formed in the LC filter 31 because the ground internal conductors 32 through 35 are placed in proximity to the coil 7.

[Modifications of First and Second Embodiments]

The present invention is not restricted to the foregoing embodiments and may be variously changed within the spirit and scope of the invention.

The coil may have any number of turns and be formed in any shape, and a suitable coil may be selected from various types according to the specification or application of the device. Moreover, any desired shape of the input/output external electrodes and the ground external electrodes may be selected, for example, the electrodes may be formed with or without folds or bends.

Further, in the aforedescribed embodiments the sheets are integrally sintered after being laminated. However, this is not exclusive, and the sheets may be sintered in advance before they are laminated. Moreover, the laminated block of the LC filter may be obtained by repeating the following procedure. A paste-like insulating material or conductive material may be applied by means such as printing, and then dried, and the material may be overlaid on the dried surface.

[Third Embodiment: FIGS. 12 through 15]

Figure 12:
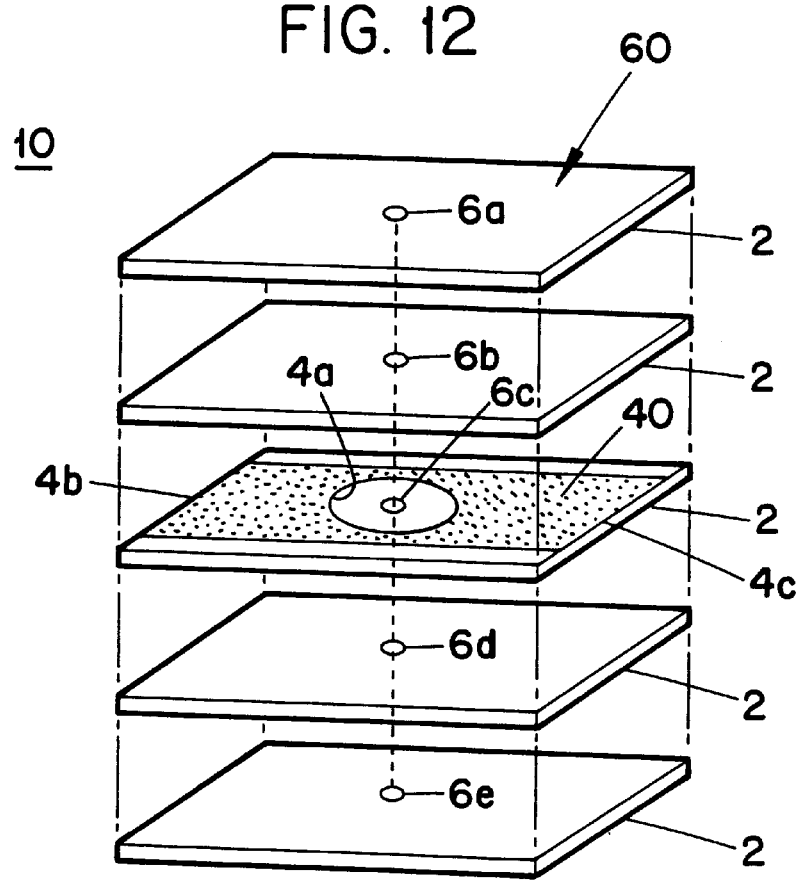
FIG. 12 is an exploded perspective view illustrating an LC filter according to a third embodiment of the present invention.

In a third embodiment, an LC filter generally represented by 10 is constructed, as illustrated in FIG. 12, of a plurality of dielectric sheets 2, i.e., dielectric sheets 2 respectively having via-holes 6a, 6b, 6d and 6e at the center thereof, and a central dielectric sheet 2 on which a ground internal conductor 40 and a via-hole 6c are formed.

The via-hole 6c is provided at the center of the central dielectric sheet 2. The ground internal conductor 40 has a circular gap 4a surrounding the via-hole 6c at a predetermined distance from the via-hole 6c and is disposed on a large area of the surface of the central dielectric sheet 2. One lead portion 4b of the internal conductor 40 is extended to the left side of the sheet 2, while the other lead portion 4c is extended to the right side of the sheet 2. A capacitance is generated between the via-hole 6c and the internal conductor 40 to form a capacitor. The via-holes 6a through 6e are formed parallel to the thickness direction of the sheet 2. The via-holes 6a through 6e are arranged in series with each other to constitute a via-conductor 60 which is axially located parallel to the thickness direction of the sheet 2. This via-conductor 60 serves as a coil.

The dielectric sheets 2 are made by kneading dielectric powder with a binder and forming a resultant mixture into sheets. The ground internal conductor 40 is made from Ag, Pd, Cu, Au, Ag—Pd, Ni, Pt and other substances and formed by means such as printing. Moreover, the via-holes 6a through 6e are formed by filling a conductive paste made from Ag, Pd, Cu, Au, Ag—Pd, Ni, Pt and other substances, into holes formed in the sheets 2.

Figure 13:
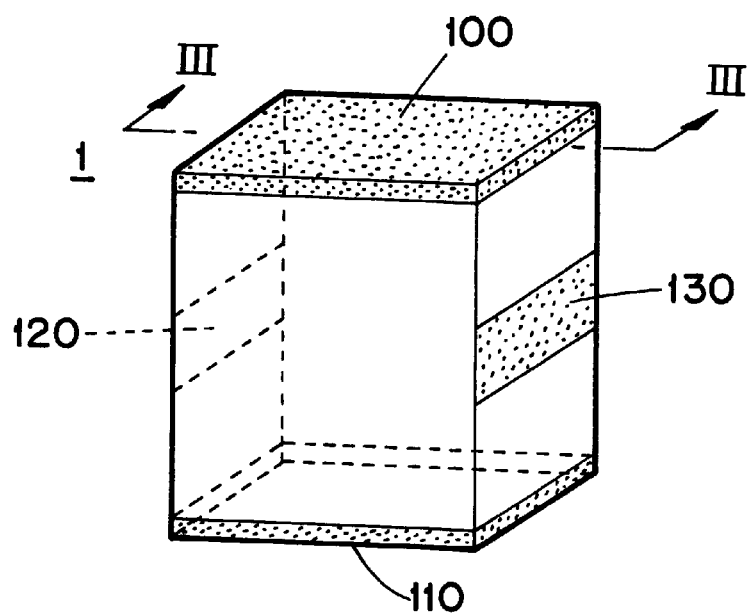
FIG. 13 is a perspective view illustrating the outer appearance of the LC filter shown in FIG. 12.
Figure 14:
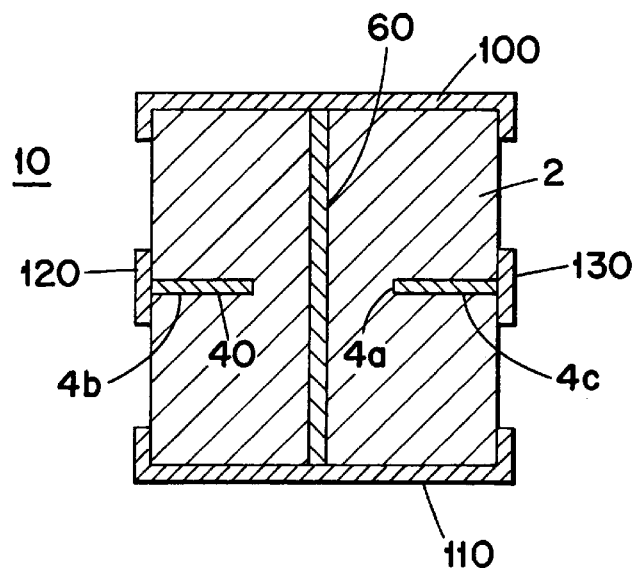
FIG. 14 is a cross-sectional view taken along line III—III of FIG. 13.
Figure 15:
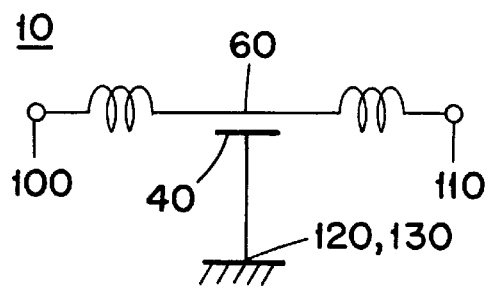
FIG. 15 is a diagram illustrating an electrical equivalent circuit of the LC filter shown in FIG. 13.

The sheets 2 are laminated and then integrally sintered to form a laminated block. Subsequently, as shown in FIGS. 13 and 14, input/output external electrodes 100 and 110 are respectively formed on the upper and lower surfaces of the laminated block, and ground external electrodes 120 and 130 are respectively disposed on the left and right lateral surfaces of the laminated block. The external electrodes 100 through 130 are formed by means such as baking, sputtering or vapor-deposition. Connected to the first input/output external electrode 100 is the upper portion of the via-conductor 60, i.e., the top portion of the first via-hole 6a. Connected to the second input/output external electrode 110 is the lower portion of the via-conductor 60, i.e., the bottom portion of the last via-hole 6e. The lead portions 4b and 4c of the ground internal conductor 40 are respectively connected to the ground external electrodes 120 and 130. FIG. 15 is a diagram illustrating an electrical equivalent circuit of the through-type LC filter 10 constructed as described above.

In the aforedescribed LC filter 10, the distance between the internal conductor 40 and each of the input/output external electrodes 100 and 110 can be made larger as compared with conventional LC filters, so that a stray capacitance generated between the conductor 40 and each of the external electrodes 100 and 110 can be suppressed. Even though the LC filter 10 is reduced in size, it can perform excellent noise reduction in a high-frequency range. Additionally, the ground internal conductor can occupy a large area of the sheet to decrease residual inductance, thereby stably exhibiting high performance of noise reduction in a high-frequency range.

Figure 16:
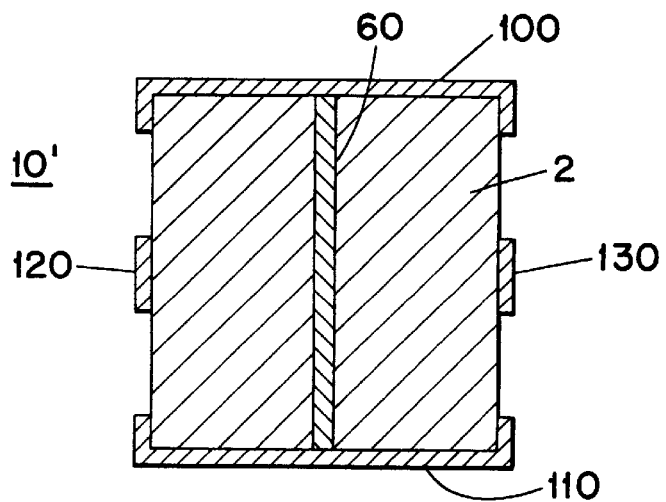
FIG. 16 is a cross-sectional view illustrating a modification of the LC filter according to the third embodiment of the present invention.

Although in the third embodiment the ground internal conductor 40 is provided, the conductor 40 may be omitted to construct an LC filter 10', as illustrated in FIG. 16.

[Fourth Embodiment: FIGS. 17 through 20]

Figure 17:
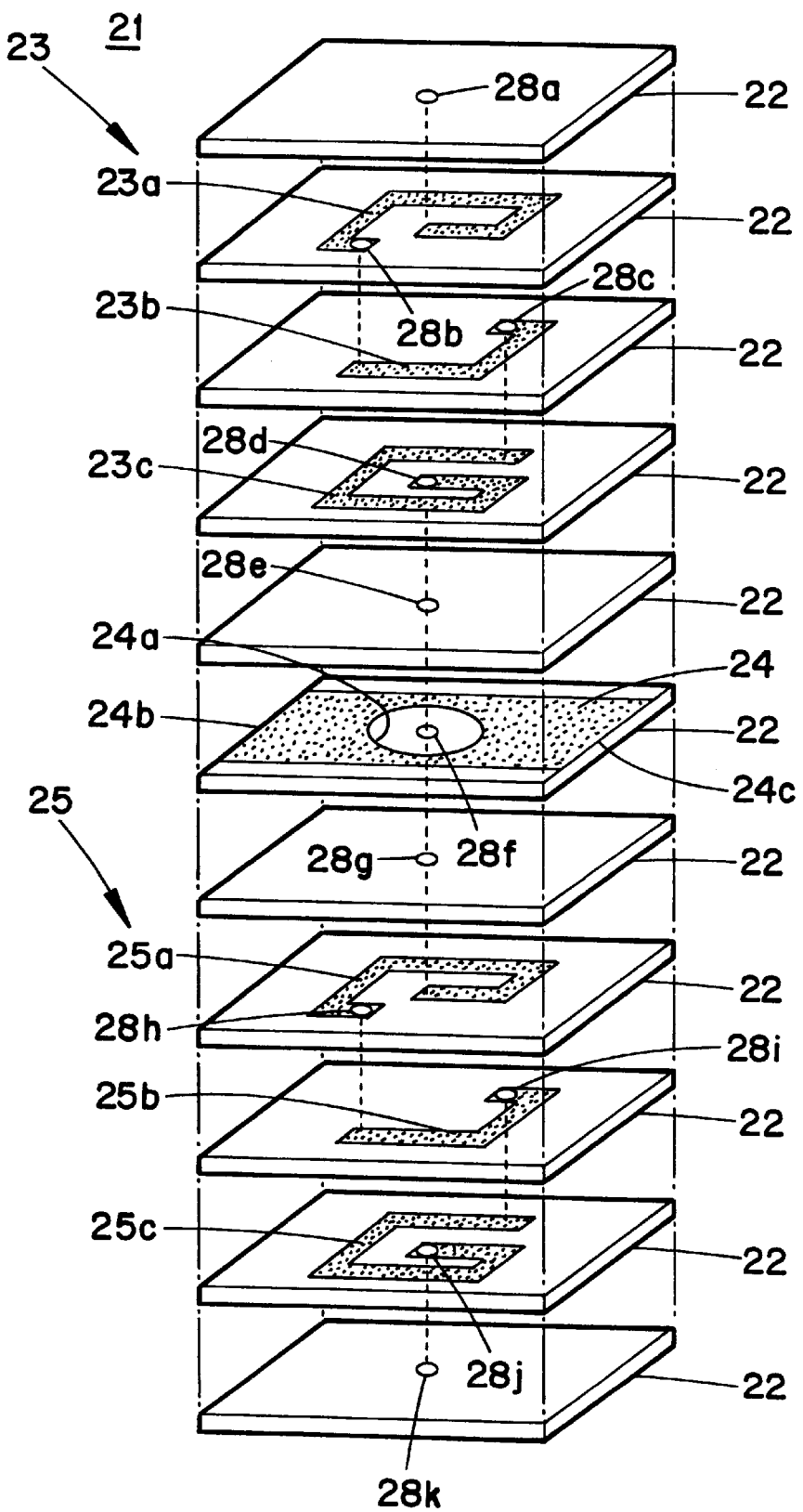
FIG. 17 is an exploded perspective view illustrating an LC filter according to a fourth embodiment of the present invention.

In a fourth embodiment, an LC filter is used as a laminated noise filter. An LC filter generally designated by 21 is constructed, as shown in FIG. 17, of a plurality of interior insulating sheets 22, i.e., insulating sheets 22 on which coil conductors 23a, 23b, 23c, 25a, 25b and 25c are respectively disposed, a central insulating sheet 22 on which a ground internal conductor 24 and a via-hole 28f are formed, and spacer insulating sheets 22 respectively provided with via-holes 28a, 28e, 28g and 28k. The insulating sheets 22 are produced by kneading dielectric powder or magnetic powder with a binder and forming a resultant mixture into sheets.

The ground internal conductor 24 has a circular gap 24a surrounding the via-hole 28f at a predetermined distance from the via-hole 28f formed at the center of the sheet 22. The conductor 24 occupies a large area of the surface of the sheet 22. One lead portion 24b of the conductor 24 extends to the left side of the sheet 22, while the other lead portion 24c extends to the right side of the sheet 22. A capacitance is produced between the via-hole 28f and the internal conductor 24, thereby forming a capacitor.

The first coil conductors 23a, 23b and 23c are connected in series to each other through via-holes 28b and 28c formed in the corresponding sheets 22 to construct a first spiral coil 23. Moreover, the second coil conductors 25a, 25b and 25c are arranged in series to each other through via-holes 28h and 28i formed in the corresponding sheets 22 to form a second spiral coil 25. Then, the first and second coils 23 and 25 are coupled in series to each other through the via-holes 28d, 28e, 28f and 28g.

Figure 18:
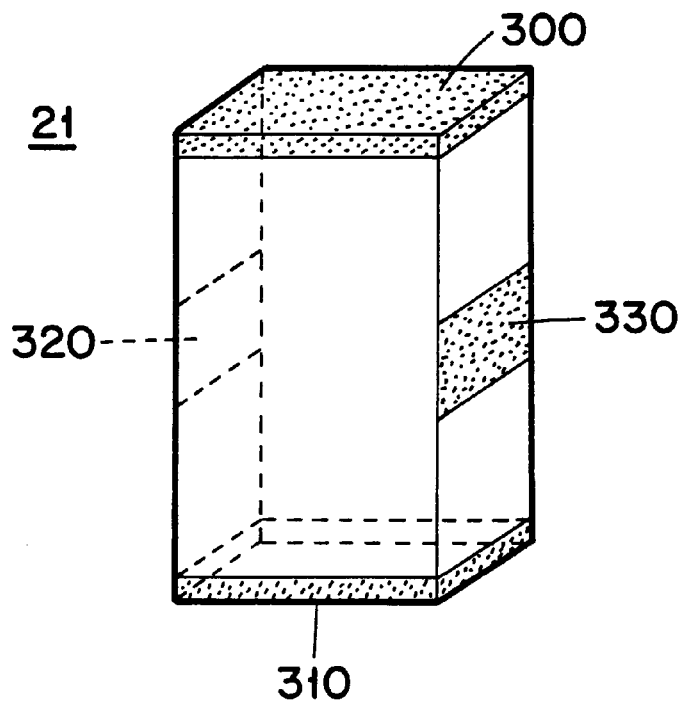
FIG. 18 is a perspective view illustrating the outer appearance of the LC filter shown in FIG. 17.
Figure 19:
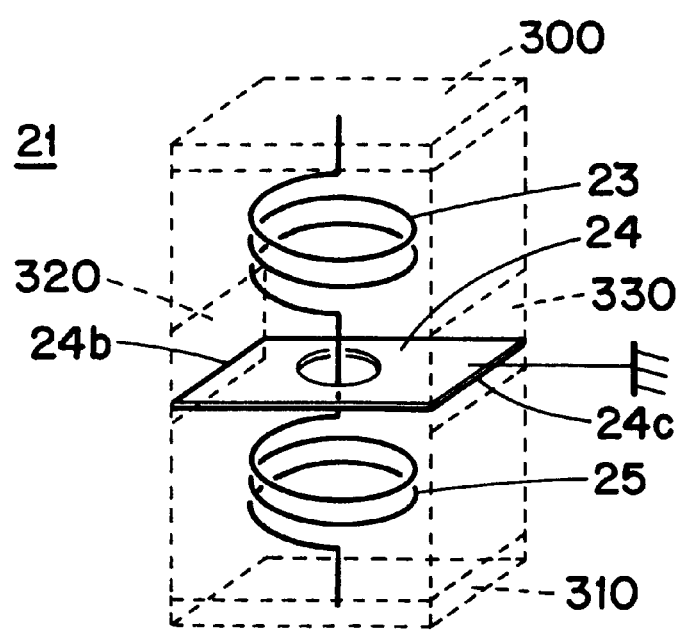
FIG. 19 is a cutaway perspective view of the LC filter shown in FIG. 18.
Figure 20:
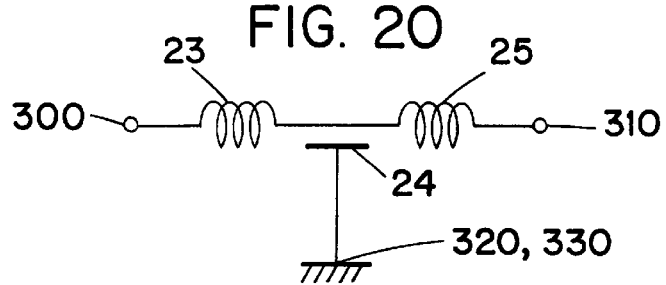
FIG. 20 is a diagram illustrating an electrical equivalent circuit of the LC filter shown in FIG. 18.

The sheets 22 are laminated and then integrally sintered to form a laminated block. Thereafter, as illustrated in FIGS. 18 and 19, input/output external electrodes 300 and 310 are respectively formed on the upper and lower surfaces of the laminated block, and ground external electrodes 320 and 330 are respectively disposed on the left and right lateral surfaces of the laminated block. Connected to the first input/output external electrode 300 is one end of the first coil 23, i.e., one end of the first coil conductor 23a through the first via-hole 28a. Moreover, connected to the second input/output external electrode 310 is one end of the second coil 25, i.e., one end of the last coil conductor 25c through the last two via-holes 28j and 28k. Further, the lead portions 24b and 24c of the ground internal conductor 24 are connected to the ground external electrodes 320 and 330, respectively. FIG. 20 is a diagram illustrating an electrical equivalent circuit of the LC filter 21 constructed as described above. The LC filter 21 performs an operation and offers advantages similar to those of the LC filter 10 of the third embodiment.

Figure 21:
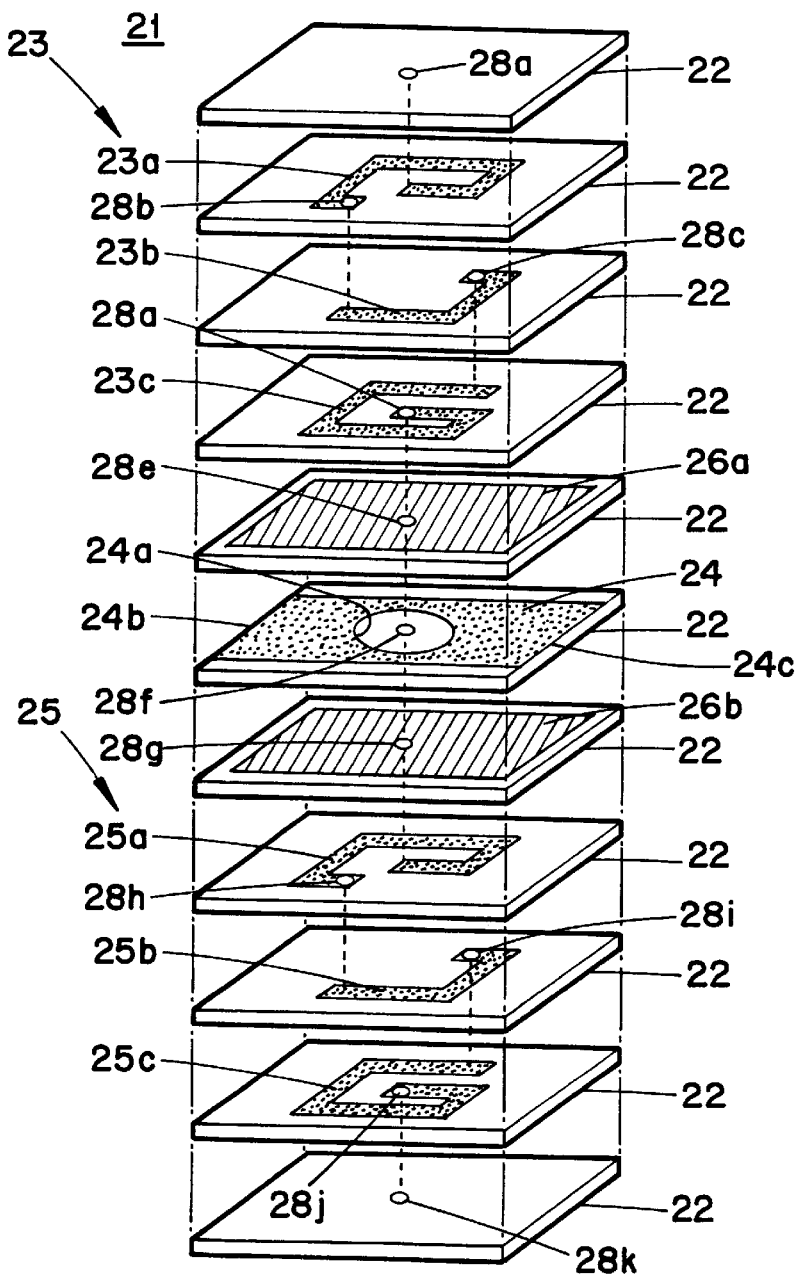
FIG. 21 is an exploded perspective view illustrating an example of modifications to the LC filter according to the fourth embodiment of the present invention.

The fourth embodiment may be modified such that at least one capacitor electrode 26 may be disposed, as shown in FIG. 21, in order to further increase the capacitance of the LC filter 21. In this LC filter 21, a first additional capacitor electrode 26a is electrically coupled to one end of the first coil 23, i.e., the third coil conductor 23c, through the fourth via-hole 28d, while a second additional capacitor electrode 26b is electrically connected to one end of the second coil 25, i.e., the coil conductor 25a through the via-hole 28g. Further, the additional electrodes 26a and 26b are electrically connected through the via-holes 28e and 28f. With this arrangement, the capacitor electrodes 26a and 26b are each disposed to opposingly face the ground internal conductor 24, thereby obtaining a large capacitance between the conductor 24 and each of the electrodes 26a and 26b. It should be noted that the number of capacitor electrodes are to be determined according to the capacitance required.

[Modifications of Third and Fourth Embodiments]

The LC filter of the present invention is not limited to the third and fourth embodiments, and it may be variously modified within the spirit and scope of the invention.

Figure 22:
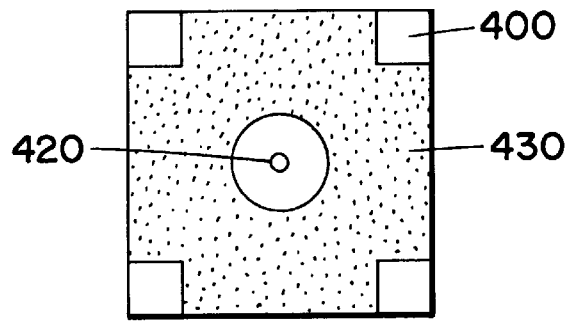
FIG. 22 is a plan view illustrating an example of modifications of an insulating sheet on which a ground internal conductor is disposed.
Figure 23:
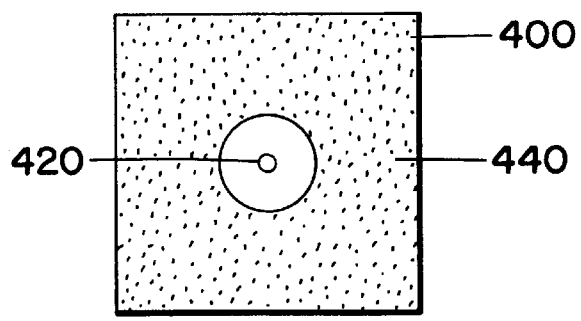
FIG. 23 is a plan view illustrating another example of modifications of an insulating sheet on which a ground internal conductor is provided.
Figure 24:
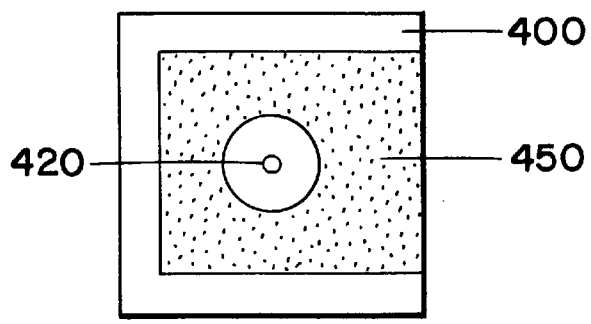
FIG. 24 is a plan view illustrating a further example of modification of an insulating sheet on which a ground internal conductor is disposed.

The ground internal conductor may be formed in any shape; the shape of the lead portions may be modified due to the restrictions in terms of the mounting operation (such as the case in which a ground pattern of a printed board cannot be made large) or owing to the use of a known method for forming external electrodes. For example, as indicated by a ground internal conductor 430 surrounding a via-hole 420 disposed on an insulating sheet 400, the lead portions except for the four corners of the sheet 400 may be extended, as illustrated in FIG. 22, to the respective sides of the sheet 400. Alternatively, as represented by a ground internal conductor 440 shown in FIG. 23, the lead portion may be extended on the overall peripheral portion of the sheet 400. Or, as designated by a ground internal conductor 450 illustrated in FIG. 24, the lead portion may be extended to only one side of the sheet 400.

Further, in the foregoing embodiments, the sheets are integrally sintered after they have been laminated. However, this is not exclusive, and sintered sheets may be laminated. Additionally, a noise filter with a laminated structure may be achieved by repeating the following procedure. A paste-like dielectric material, magnetic material or conductive material is applied by means such as printing and then dried, and the material is overlaid on the dried surface.

[Fifth Embodiment: FIGS. 25 through 30]

An explanation will now be given of an LC filter according to a fifth embodiment of the present invention while referring to FIGS. 25 through 30. An LC filter generally indicated by 101 is constructed, as shown in FIG. 25, such that a capacitor section 104 is interposed between inductor sections 102 and 103. An input external electrode 105 and an output external electrode 106 are respectively provided on the left and right sides of the filter 101, and ground external electrodes 107 and 108 are respectively disposed on the proximal side and the distal side of the filter 101.

In the filter 101, coils 16 and 17 integrated into the inductor sections 102 and 103, respectively, are axially located perpendicular to the external electrodes 105 and 106, as schematically shown in FIG. 26. One end of the first coil 16 is electrically connected to the first input external electrode 105, while one end of the second coil 17 is electrically coupled to the second output external electrode 106.

Figure 27:
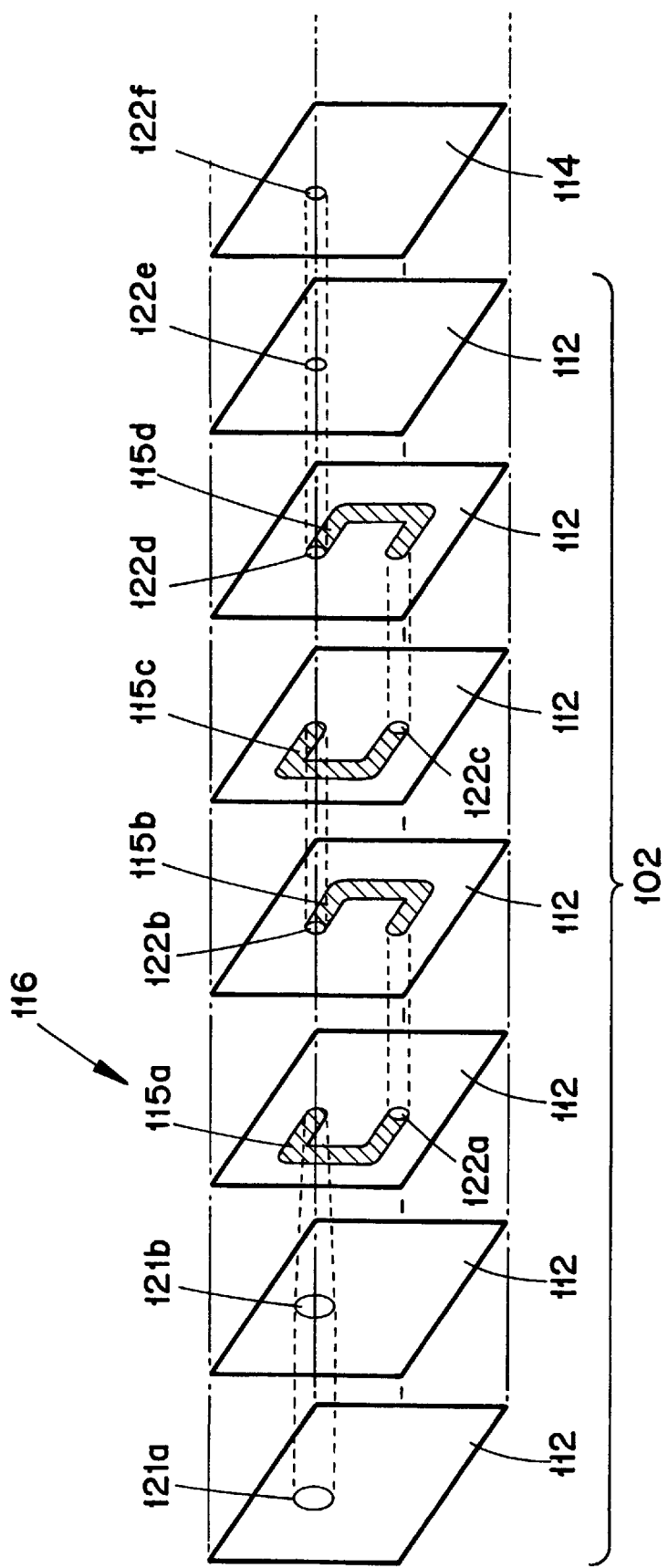
FIG. 27 is an exploded perspective view illustrating one inductor section of the LC filter shown in FIG. 25.

The structure of the filter 101 will now be described in greater detail with reference to FIGS. 27 through 29. The inductor section 102 is constructed, as illustrated in FIG. 27, of a plurality of magnetic sheets 112, and more specifically, magnetic sheets 122 on which coil conductors 115a, 115b, 115c and 115d and associated relay via-holes 122a, 122b, 122c and 122d are respectively formed, magnetic sheets 122 respectively provided with lead via-holes 121a and 121b, and a magnetic sheet 112 provided with a relay via-hole 122e. The magnetic sheets 112 are obtained by kneading magnetic powder, such as ferrite, with a binder and forming a resulting mixture into sheets.

The lead via-holes 121a and 121b are sized larger than the relay via-holes 122a through 122e. More specifically, the diameters of the lead via-holes 121a and 121b are determined, for example, to range from 200 to 300 $\mu$m, while the diameter of the relay via-holes 122a through 122e are set to range from 100 to 200 $\mu$m. Since the relay via-holes 122a through 122d are formed in the same sheets 112 on which the coil conductors 115a through 115d are respectively disposed, they are provided in only restricted areas of the sheets 112, thereby hampering enlargement of the relay via-holes 122a through 122d. In contrast, since the lead via-holes 121a and 121b are formed in the sheets 112 free from other elements, such as conductors, they can be enlarged without restriction. Likewise, below-described via-holes 121c and 121d can also be enlarged.

Figure 28:
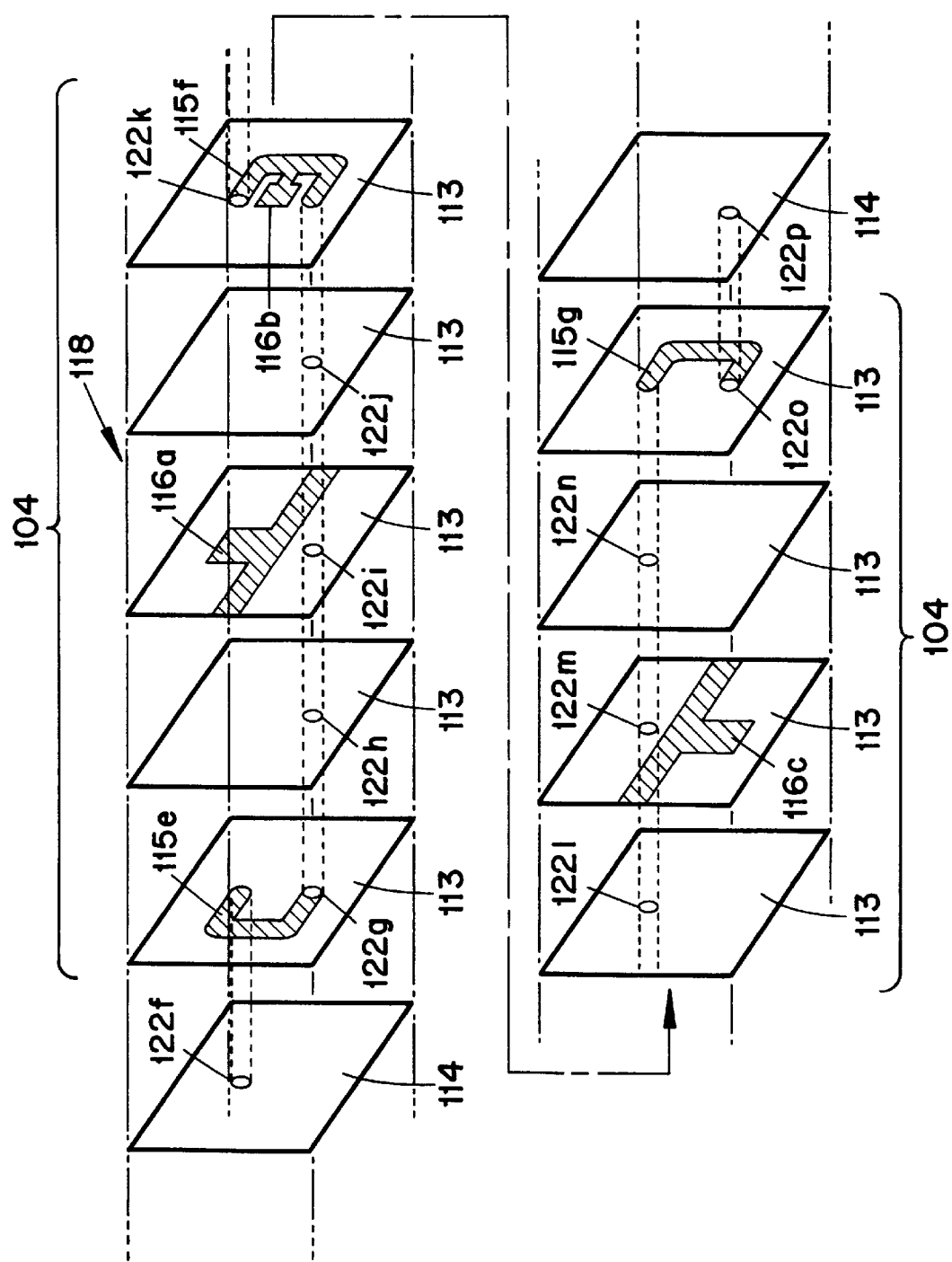
FIG. 28 is an exploded perspective view illustrating the capacitor section of the LC filter shown in FIG. 25.

The capacitor section 104 is constructed, as shown in FIG. 28, of a plurality of dielectric sheets 113, and more specifically, dielectric sheets 113 on which coil conductors 115e and 115g are respectively disposed, dielectric sheets 113 on which capacitor electrodes 116a and 116c are respectively formed, a dielectric sheet 113 provided with a coil conductor 115f and a capacitor electrode 116b electrically connected to the central portion of the conductor 115f, and dielectric sheets 113 respectively provided with relay via-holes 122h, 122i, 122l aand 122n. Each of the capacitor electrodes 116a and 116c is extended at one end to the proximal side of the sheet 113 and at the other end to the distal side of the sheet 113. The dielectric sheets 113 are produced by kneading dielectric powder with a binder and forming a resulting mixture into sheets.

Figure 29:
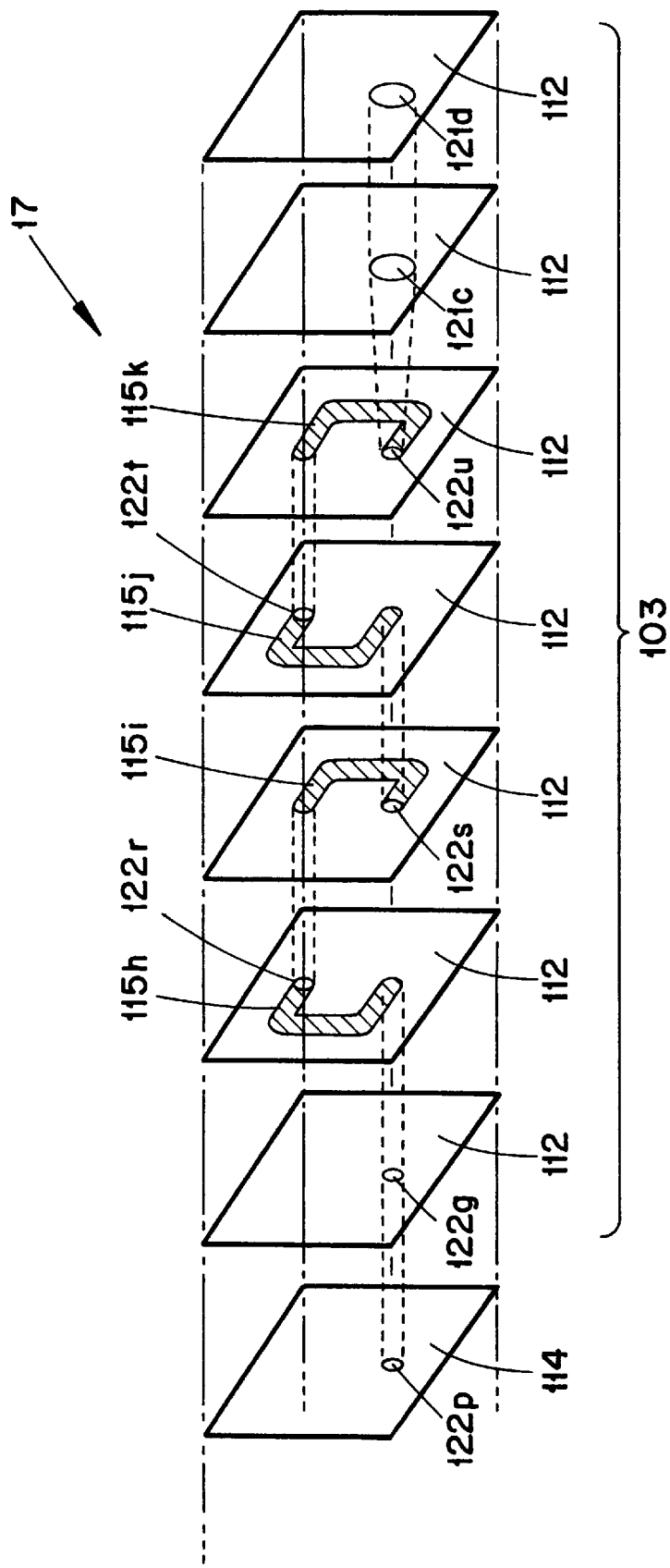
FIG. 29 is an exploded perspective view illustrating the other inductor section of the LC filter shown in FIG. 25.

The inductor section 103 is constructed, as illustrated in FIG. 29, of a plurality of magnetic sheets 112, i.e., magnetic sheets 112 on which coil conductors 115h, 115i, 115j and 115k and corresponding relay via-holes 122r, 122s, 122t and 122u are respectively disposed, magnetic sheets 112 provided with lead via-holes 121c and 121d, and a magnetic sheet 112 provided with a relay via-hole 122g. The lead via-holes 121c and 121d are sized greater than the relay via-holes 122g through 122u.

Intermediate insulating sheets 114 are disposed between the inductor section 102 and the capacitor section 104 and between the inductor section 103 and the capacitor section 104. The insulating sheets 114 prevent the occurrence of peeling and cracking caused by a disparity in thermal expansion coefficient between the inductor sections 102 and 103 and the capacitor section 104. In response to this requirement, the intermediate insulating sheets 114 are made by kneading a powder mixture of a magnetic material and an insulating material with a binder and forming a resultant mixture into sheets.

The coil conductors 115a through 115f (only the bottom half of the conductor 115f) are electrically connected in series to each other through the corresponding relay via-holes 122a through 122j formed in the sheets 112, 113 and 114, thereby constructing a solenoid coil 16. Moreover, the coil conductors 115f through 115k (only the top half of the conductor 115f) are electrically connected in series to each other through the associated relay via-holes 122k through 122t formed in the sheets 112, 113 and 114, thereby forming a solenoid coil 17.

Further, the capacitor electrode 116b is placed to opposingly face each of the capacitor electrodes 116a and 116c, and a capacitor 118 is formed by these capacitor electrodes 116a through 116c. The coil conductors 115a through 115k and the capacitor electrodes 116a through 116c are made from Ag, Pd, Ag—Pd, Cu and other substances and formed on the surfaces of the sheets 112, 113 and 114 by a known method, such as printing, sputtering, or vapor-deposition.

The individual sheets 112, 113 and 114 are laminated and then integrally sintered to produce a laminated block in which the capacitor section 104 is interposed between the inductor sections 102 and 103, as shown in FIG. 25. Then, the input external electrode 105 and the output external electrode 106 are respectively provided on the left and right lateral surfaces of the laminated block, and the ground external electrodes 107 and 108 are respectively disposed on the proximal side and the distal side of the laminated block. The external electrodes 105 through 108 are produced by means such as sputtering, vapor-deposition or baking.

Figure 30:
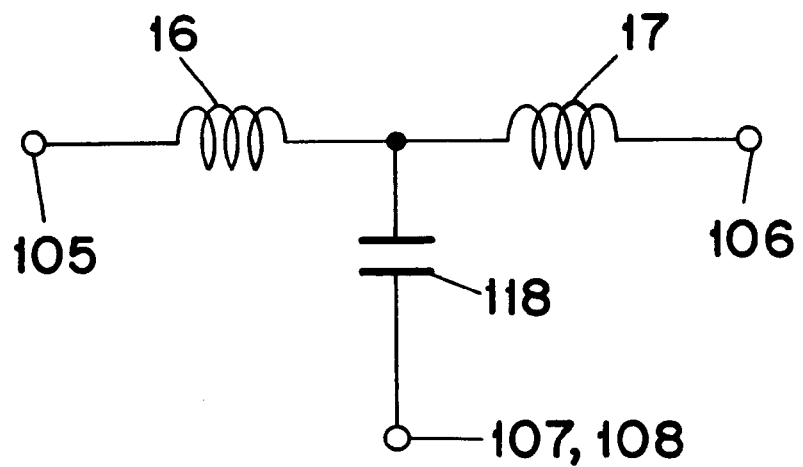
FIG. 30 is a diagram illustrating an electrical equivalent circuit of the LC filter shown in FIG. 25.

The input external electrode 105 is electrically coupled to one end of the coil 16, i.e, one end of the coil conductor 115a, through the lead via-holes 121a and 121b. The output external electrode 106 is electrically connected to one end of the coil 17, i.e., one end of the coil conductor 115k, through the lead via-holes 121c and 121d. Further, the ground external electrode 107 is electrically connected to one end of each of the capacitor electrodes 116a and 116c, while the ground external electrode 108 is electrically connected to the other end of each of the capacitor electrodes 116a and 116c. FIG. 30 is a diagram illustrating an electrical equivalent circuit of the LC filter 101.

In the thus-obtained LC filter 101, the sheets 112, 113 and 114 are laminated in a direction perpendicular to the external electrodes 105 through 108, and the coils 16 and 17 are axially located in a direction perpendicular to the external electrodes 105 and 106. Accordingly, stray capacitances produced in a distributed form between the coils 16 and 17 and the external electrodes 105 through 108 can be suppressed to an extremely minor level due to small potential differences between the coil 16 and the input external electrode 105 and between the coil 17 and the output external electrode 106 and wide spacings between the coil 16 and the output external electrode 106 and between the coil 17 and the input external electrode 105. As a consequence, the influences of stray capacitances are practically negligible, thereby achieving an LC filter 101 having superior insertion-loss characteristics in a high-frequency range.

Further, the input external electrode 105 and the coil 16 are electrically coupled through the large-sized lead via-holes 121a and 121b, thereby increasing the area where the electrode 105 and the coil 16 are connected. This can improve the connection reliability of the two elements and also decrease the direct current resistance produced between the connection area. Likewise, the connection reliability of the output external electrode 106 and the coil 17 can be enhanced, and the direct current resistance between the connection area can also be decreased.

[Modification of Fifth Embodiment]

It is to be understood that the invention is not limited to the specific embodiments thereof and various modifications may be made without departing from the spirit and scope of the invention.

In the foregoing embodiments, two sheets provided with lead via-holes are used to establish an electrical connection between an external electrode and a coil. The lead via-hole directly connected to the external electrode may be made large, and the other lead via-hole may be sized similar to the relay via-holes.

Figure 31:
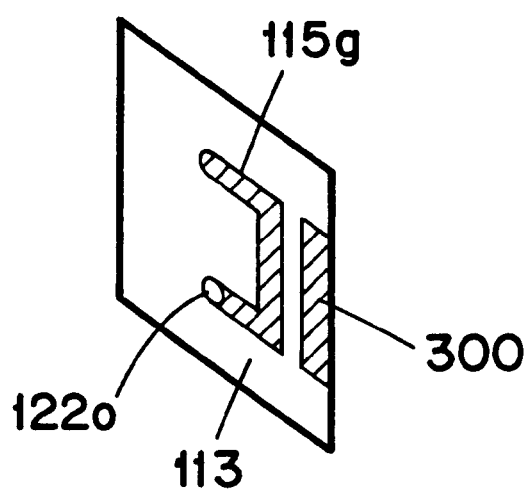
FIG. 31 is a perspective view illustrating a modification of a dielectric sheet of the LC filter shown in FIG. 25.

The capacitor section may be formed of a plurality of laminated dielectric sheets provided with only relay via-holes. In this case, the relay via-holes are arranged in series to each other to produce distributed capacitances between a via-conductor disposed within the capacitor section and ground external electrodes, thereby forming a capacitor. Alternatively, the capacitor section may be formed of a plurality of laminated dielectric sheets provided with only capacitor electrodes and relay via-holes. Further, the capacitor section may be constructed, as shown in FIG. 31, of a plurality of dielectric sheets 113 on which a coil conductor 115g and a ground internal electrode 300 located in proximity to the conductor 115g are formed. In this case, the ground internal electrode 300 may be electrically connected to the ground external electrode 107, and the coil conductors 115g may be connected in series to each other through relay via-holes 122o to form a solenoid coil within the capacitor section 104. Thus, distributed capacitances are generated between the solenoid coil and the internal electrodes 300. A capacitor can thus be obtained.

Although this embodiment has been explained in which the LC filter is formed of an inductor-capacitor-inductor structure, the filter may be constructed of an inductor-capacitor structure or an inductor-capacitor-inductor-capacitor-inductor structure. Additionally, a resistor may be integrated into the capacitor section, or an extra insulating layer having a built-in resistor may be laminated.

Moreover, in the foregoing embodiment, magnetic sheets each provided with a conductor and dielectric sheets are laminated and then integrally sintered. This is not, however, exclusive, and sintered sheets may be laminated. Further, an LC filter may be produced according to the following method. A paste-like magnetic material may be applied to form a magnetic layer by means such as printing, and then, a paste-like conductive material may be overlaid on the surface of the magnetic layer to form a desired conductor. Subsequently, the conductor may be coated with a paste-like magnetic material to form a magnetic layer having a built-in conductor. Similarly, a dielectric layer integrating a conductor therein may be deposited on the magnetic layer. In this fashion, the above procedure may be repeated to obtain an LC filter having a laminated structure.

Additionally, the equivalent circuit of an LC filter is not restricted to being T-type and may be π-type or L-type.

As is seen from the foregoing description, the LC filter of the present invention offers the following advantages.

According to one form of the present invention, the coils are axially placed perpendicular to the input/output external electrodes, thereby reducing stray capacitances generated between the coils and the input/output external electrodes to a minimal level. It is thus possible to attain an LC filter that exhibits excellent attenuation characteristics in a high-frequency range and provides sufficient performance as a noise filter.

Also, since the coils are axially placed parallel to the mounting surface of the filter, the direction of magnetic flux generated in the coils is also parallel to the mounting surface. Accordingly, when the LC filter is mounted on a printed wiring board, the self inductance and Q-factor can be substantially preserved. This eliminates the need for changing the design of a printed wiring board and obviates complicated work, such as selection of LC constants by cut-and-try methods.

Moreover, by using a dielectric material or a magnetic material having a relative dielectric constant of 10 or greater as the material for insulating layers, a high-performance LC filter achieving noise reduction and integrating a capacitor which exhibits a desired capacitance can be implemented. Further, ground internal conductors interconnected to each other through ground via-holes are placed in proximity to the coils, thereby obtaining an LC filter integrating a capacitor which exhibits an even larger capacitance.

According to another form of the invention, a via-hole and a ground internal conductor surrounding this via-hole at a predetermined distance from the via-hole are disposed on an insulating layer. This increases the distance between the ground internal conductor and input/output external electrodes, thereby inhibiting stray capacitances produced therebetween. Additionally, a large-sized internal conductor can be guaranteed to reduce residual inductances. As a result, an LC filter which stably presents good noise reduction performance in a high-frequency range can be obtained.

According to a further form of the invention, since the coils are axially located perpendicular to the external electrodes, stray capacitances produced between the coils and the external electrodes can be reduced to a minimal level. Thus, an LC filter exhibiting excellent insertion-loss characteristics in a high-frequency range can be accomplished. Additionally, the lead via-holes are sized larger than the relay via-holes, thereby improving the connection reliability of the coils and the external electrodes and also reducing the direct current resistance generated therebetween.

What is claimed is:

1. An LC filter comprising:
    a laminated block including a lamination of a plurality of internal conductors and insulating layers forming a coil having an axis and a width;
    an input/output external electrode disposed on an end of said laminated block; and
    a ground external electrode disposed on at least one side of said laminated block, said at least one side being parallel and adjacent to said axis of said coil formed by said plurality of internal conductors, wherein a capacitance is formed between said ground electrode and said coil;
    wherein said axis of said coil formed by said plurality of internal conductors is perpendicular to said end upon which the input/output external electrode is disposed.

2. An LC filter according to claim 1, wherein said plurality of internal conductors comprises a plurality of coil conductors which collectively constitute said coil which is axially perpendicular to said input/output external electrode, said plurality of coil conductors and insulating layers being in said lamination in a direction perpendicular to said input/output external electrode.

3. An LC filter according to claim 2, further comprising a ground internal conductor provided in proximity to at least two of said coil conductors located on said plurality of insulating layers, and said ground internal conductors are electrically interconnected to each other through ground via-holes.

4. An LC filter according to claim 1, wherein said plurality of internal conductors comprises a plurality of coil conductors which collectively constitute said coil axially parallel to a mounting surface of said laminated block, said plurality of coil conductors and insulating layers being in said lamination in a direction parallel to said mounting surface.

5. An LC filter according to claim 4, further comprising:
   ground internal conductors provided in proximity to at least two of said coil conductors located on said plurality of insulating layers, and said ground internal conductors being electrically interconnected to each other through ground via-holes.

6. An LC filter according to claim 1, wherein said plurality of internal conductors are via-holes.

7. An LC filter comprising:
   a laminated block including a lamination of a plurality of coil via-holes respectively interposed between a plurality of insulating layers;
   an input/output external electrode disposed on a surface of said laminated block; and
   a ground external electrode disposed on a side of said laminated block,
   wherein magnetic flux lines of said plurality of said via-holes are perpendicular to said input/output external electrode, and wherein at least one of said plurality of insulating layers comprises a ground internal conductor surrounding said via-hole at a preset distance from said via-hole.

8. An LC filter comprising:
   a laminated block including a lamination of a plurality of internal conductors and insulating layers;
   an input/output external electrode disposed on a single end of said laminated block; and
   a ground external electrode disposed on at lease one side of said laminated block,
   wherein an axis of said plurality of internal conductors is perpendicular to said input/output external electrode, wherein said plurality of internal conductors comprises a plurality of coil conductors which collectively constitute at least one coil axially parallel to said input/output external electrode, said plurality of coil conductors and insulating layers being in said lamination in a direction parallel to said input/output external electrode, and wherein said coil conductors are electrically interconnected to each other through relay openings in the form of a coil which is electrically connected at one end to said at least one input/output external electrode through a lead opening, and the cross-section of said lead opening is larger than the cross-section of said relay openings.

9. An LC filter comprising:
   a laminated block including a lamination of a plurality of internal conductors and insulating layers;
   an input/output external electrode disposed on a single end of said laminated block; and
   a ground external electrode disposed on at least one side surface of said laminated block,
   wherein an axis of said plurality of internal conductors is perpendicular to said input/output external electrode, wherein said plurality of internal conductors comprises a plurality of coil conductors which collectively constitute at least one coil axially parallel to a mounting surface of said laminated block, said plurality of coil conductors and insulating layers being in said lamination in a direction parallel to said mounting surface, and wherein said coil conductors are electrically interconnected to each other through relay openings in the form of a coil which is electrically connected at one end to said input/output external electrode through a lead opening, and the cross-section of said lead opening is larger than the cross-section of said relay openings.

10. An LC filter comprising:
    a laminated block including a lamination of a plurality of internal conductors and insulating layers;
    an input/output external electrode disposed on a single end of said laminated block; and
    a ground external electrode disposed on at least one side of said laminated block,
    wherein an axis of said plurality of internal conductors is perpendicular to said input/output external electrode, wherein said plurality of internal conductors comprises a plurality of coil conductors which collectively constitute at least one coil axially parallel to said input/output external electrode, said plurality of coil conductors and insulating layers being in said lamination in a direction parallel to said input/output external electrode, and wherein at least one of said plurality of insulating layers includes a via-hole electrically connected to said coil conductors, and a ground internal electrode surrounding said via-hole at a preset distance from said via-hole.

11. An LC filter according to claim 10, further comprising a capacitor electrode electrically connected to said coil conductors and opposingly facing said ground internal electrode so as to form a capacitor.

12. An LC filter comprising:
    a laminated block including a lamination of a plurality of internal conductors and insulating layers;
    an input/output external electrode disposed on a single end of said laminated block; and
    a ground external electrode disposed on at least one side of said laminated block,
    wherein an axis of said plurality of internal conductors is perpendicular to said input/output external electrode, wherein said plurality of internal conductors comprises a plurality of coil conductors which collectively constitute at least one coil axially parallel to a mounting surface of said laminated block, said plurality of coil conductors and insulating layers being in said lamination in a direction parallel to said mounting surface, and wherein at least one of said plurality of insulating layers includes a via-hole electrically connected to said coil conductors, and a ground internal electrode surrounding said via-hole at a preset distance from said via-hole.

13. An LC filter according to claim 12, further comprising a capacitor electrode electrically connected to said coil conductors and opposingly facing said ground internal electrode so as to form a capacitor.

14. An LC filter comprising:
    a laminated block including a lamination of a plurality of internal coil conductors respectively interposed between a plurality of insulating layers forming a coil having an axis and a width;

an input/output external electrode disposed on an end of said laminated block; and a ground external electrode disposed on a side of said laminated block, said side being parallel and adjacent to said axis of said coil formed by said plurality of internal conductors, wherein a capacitance is formed between said ground electrode and said coil;

wherein an axis of magnetic flux lines of said plurality of said internal conductors is perpendicular to said input/output external electrode.

15. An LC filter according to claim 14, further comprising a ground internal conductor provided in proximity to each of said coil conductors formed on said plurality of insulating layers, and said ground internal conductors are electrically interconnected to each other through ground via-holes.

16. An LC filter according to claim 14, wherein said plurality of internal conductors are via-holes.

17. An LC filter comprising:

a laminated block including a lamination of a plurality of internal coil conductors respectively interposed between a plurality of insulating layers;

at least one input/output external electrode disposed on a surface of said laminated block; and a ground external electrode disposed on another surface of said laminated block;

wherein magnetic flux lines of said plurality of said internal conductors are perpendicular to said input/output external electrode; and wherein said coil conductors are electrically interconnected to each other through relay openings in the form of at least one coil which is electrically connected at one end to said at least one input/output external electrode through a lead opening, and the cross-section of said lead opening is larger than the cross-section of said relay openings.

18. An LC filter comprising:

a laminated block including a lamination of a plurality of via-holes and insulating layers;

an input/output external electrode disposed on an end of said laminated block; and a ground external electrode disposed on a side of said laminated block, wherein an axis of said plurality of via-holes is perpendicular to said input/output external electrode, and wherein at least one of said plurality of insulating layers comprises a ground internal conductor surrounding one of said via-holes at a predetermined distance from said via-hole.

19. An LC filter comprising:

a laminated block including a lamination of a plurality of internal coil conductors respectively interposed between a plurality of insulating layers;

an input/output external electrode disposed on a single end of said laminated block; and a ground external electrode disposed on side of said laminated block, wherein magnetic flux lines of said plurality of said internal conductors are perpendicular to said input/output external electrode, and wherein at least one of said plurality of insulating layers includes a via-hole electrically connected to said coil conductors, and a ground internal electrode surrounding said via-hole at a preset distance from said via-hole.

20. An LC filter according to claim 19, further comprising a capacitor electrode electrically connected to said coil conductors and opposingly facing said ground internal electrode so as to form a capacitor.

* * * * *